(12) United States Patent
Tessariol et al.

(10) Patent No.: US 8,742,481 B2
(45) Date of Patent: Jun. 3, 2014

(54) APPARATUSES AND METHODS COMPRISING A CHANNEL REGION HAVING DIFFERENT MINORITY CARRIER LIFETIMES

(75) Inventors: Paolo Tessariol, Montebelluna (IT); Aurelio Giancarlo Mauri, Meda (IT); Akira Goda, Boise, ID (US); Yijie Zhao, Boise, ID (US)

(73) Assignee: Micron Technology, Inc., Boise, ID (US)

(*) Notice: Subject to any disclaimer, the term of this patent is extended or adjusted under 35 U.S.C. 154(b) by 385 days.

(21) Appl. No.: 13/211,033

(22) Filed: Aug. 16, 2011

(65) Prior Publication Data

US 2013/0043505 A1 Feb. 21, 2013

(51) Int. Cl.
*H01L 27/108* (2006.01)

(52) U.S. Cl.
USPC ............... 257/296; 257/315; 257/E21.679

(58) Field of Classification Search
CPC ............ H01L 27/11524; H01L 27/11529; H01L 27/11573; H01L 27/11556; H01L 29/812
USPC ......... 257/260, 261, 296, 300, 314, 315, 316, 257/E21.646, E21.66, E21.661, E21.679, 257/E21.68; 438/201, 257, 261, 264, 268
See application file for complete search history.

(56) References Cited

U.S. PATENT DOCUMENTS

| | | | |
|---|---|---|---|
| 5,885,872 A * | 3/1999 | Tamaki et al. ............... 438/275 |
| 6,232,642 B1 | 5/2001 | Yamazaki | |
| 6,333,217 B1 * | 12/2001 | Umimoto et al. ............. 438/197 |
| 6,897,531 B2 | 5/2005 | Ohsawa | |
| 7,671,425 B2 | 3/2010 | Miyanaga et al. | |
| 7,696,559 B2 * | 4/2010 | Arai et al. ...................... 257/316 |
| 8,093,145 B2 * | 1/2012 | Morris .......................... 438/527 |
| 2006/0278913 A1 * | 12/2006 | Mihnea et al. ................ 257/314 |
| 2008/0061358 A1 * | 3/2008 | Choi ............................. 257/319 |
| 2008/0083943 A1 | 4/2008 | Walker | |
| 2008/0272403 A1 * | 11/2008 | Saha et al. .................... 257/256 |
| 2009/0011559 A1 * | 1/2009 | Mizukami et al. ............ 438/257 |
| 2010/0118610 A1 | 5/2010 | Katsumata et al. | |
| 2010/0142291 A1 | 6/2010 | Carmen | |
| 2010/0155858 A1 * | 6/2010 | Chen ............................. 257/402 |
| 2010/0159657 A1 | 6/2010 | Arai et al. | |
| 2010/0213527 A1 | 8/2010 | Shim et al. | |
| 2010/0314678 A1 | 12/2010 | Lim et al. | |
| 2011/0115014 A1 | 5/2011 | Ichinose et al. | |
| 2011/0280076 A1 * | 11/2011 | Samachisa et al. ...... 365/185.17 |

FOREIGN PATENT DOCUMENTS

| | | |
|---|---|---|
| KR | 1020070091833 A | 9/2007 |
| WO | WO-2013025719 A2 | 2/2013 |
| WO | WO-2013025719 A3 | 2/2013 |

OTHER PUBLICATIONS

"International Application Serial No. PCT/US2012/050796, International Search Report and Written Opinion mailed Mar. 4, 2013", 12 pgs.

* cited by examiner

*Primary Examiner* — Cuong Q Nguyen
*Assistant Examiner* — Yosef Gebreyesus
(74) *Attorney, Agent, or Firm* — Schwegman, Lundberg & Woessner, P.A.

(57) ABSTRACT

Apparatuses, such as memory devices, memory cell strings, and electronic systems, and methods of forming such apparatuses are shown. One such apparatus includes a channel region that has a minority carrier lifetime that is lower at one or more end portions, than in a middle portion. Other apparatuses and methods are also disclosed.

29 Claims, 7 Drawing Sheets

APPARATUSES AND METHODS COMPRISING A CHANNEL REGION HAVING DIFFERENT MINORITY CARRIER LIFETIMES

BACKGROUND

Memory devices with greater density are always in demand. Forming memory devices laterally on a surface of a semiconductor chip uses a great deal of chip real estate. Improved memory devices are needed with new configurations to further increase memory density beyond traditional memory devices.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical changes, etc. may be made.

Figure 1A:
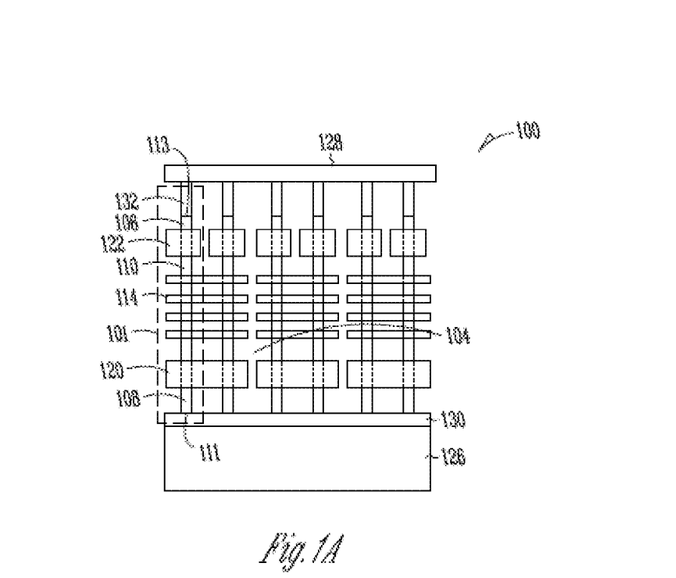
FIG. 1A shows a memory device according to an embodiment of the invention.
Figure 1B:
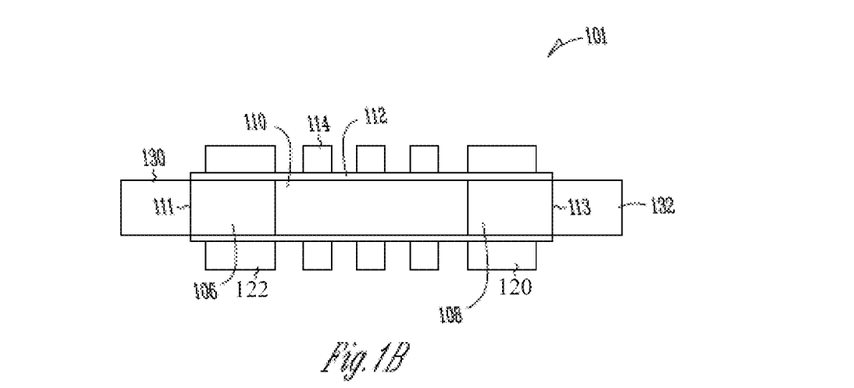
FIG. 1B shows a block diagram of a memory string from FIG. 1A according to an embodiment of the invention.

FIG. 1A shows an apparatus in the form of a memory device 100 formed on a substrate 102. FIG. 1B shows a memory string 101 from FIG. 1A. Charge storage structures 112 (e.g., a combination of a tunnel dielectric, polysilicon, and a charge blocking material; a combination of a nitride, an oxide, and a nitride; or any other combination of materials that can provide a charge storage function, whether currently known or developed in the future), substantially surround an elongated channel region 110, as shown in FIG. 1B, to form a respective charge storage structure corresponding to each of a plurality of memory cell gates 114 (which may also substantially surround respective cross sections of the elongated channel region 110 and charge storage structure(s) 112). The charge storage structures may be a respective plurality of portions of a single structure, or may comprises a plurality of separate, discrete structures.

A first select gate 120 and a second select gate 122 are shown to selectively couple the elongated channel region 110 to source region 130 and a drain region 132, respectively. A dielectric 104 can fill in spaces between components such as those described above.

In one example, the elongated channel region 110 is formed from a semiconductor material, such as p-type and/or undoped polysilicon. The elongated channel region 110 can be formed in multiple process actions, such as where a first end 111 is formed in a different polysilicon deposition activity than that used to form other portions of the elongated channel region 110, such as the second end 113 and/or a middle portion. A source region 130 and a drain region 132 are shown coupled to the first end 111 and the second end 113 of the elongated channel region 110, respectively. In one example, the source region 130 and the drain region include n-type semiconductor material, such as n+ polysilicon.

During operation, the path comprising source region 130, elongated channel region 110, and drain region 132 acts as an n-p-n transistor, with select gates 120, 122, and memory cell gates 114 operating to allow (or inhibit) signal transmission along the way. Components comprising the source region 130, the elongated channel region 110, the drain region 132, select gates 120, 122, charge storage structures 112, and memory cell gates 114 together form a memory string 101. In one example, the memory string is configured in a circuit to operate as a NAND memory string.

A source line 126 and a data line, such as bitline 128, are shown coupled to the source region 130 and the drain region 132, respectively. The source line 126 and bitline 128 can comprise, consist of, or consist essentially of metal, such as aluminum, copper, or tungsten, or alloys of these or other conductor metals. In the present disclosure, the term "metal" further comprises metal nitrides, or other materials that operate primarily as conductors.

FIG. 1B shows a block diagram of memory string 101 from FIG. 1A. The number of memory cell gates 114 shown in the figures are for illustration purposes only. In one example, memory string 101 comprises eight memory cell gates 114 between the select gates 120, 122.

The channel region 110 can include a first recombination region 106, and a second recombination region 108 (and a body region between the first recombination region and the second recombination region), as shown in FIGS. 1A and 1B. The first recombination region 106 and the second recombination region 108 are formed as part of the elongated channel region 110, and can be of the same conductivity type. In one example, the first recombination region 106 and the second recombination region 108 are configured to have a minority carrier lifetime that is lower than the minority carrier lifetime of the body region of the elongated channel region 110. In one example, the first recombination region 106 and the second recombination region 108 are formed in substantially similar configurations, and have substantially the same minority carrier lifetime. In one example, the first recombination region 106 and the second recombination region 108 have different minority carrier lifetimes, where both minority carrier lifetimes are lower than the minority carrier lifetime of the body region of the elongated channel region 110.

A number of configurations and associated processes of formation are possible for the first recombination region 106 and the second recombination region 108. In one example, the first recombination region 106 and the second recombination region 108 are doped to a higher concentration than the body region 110 to provide the lower minority carrier lifetime. In one example, the elongated channel region (comprising the first and second recombination regions 106, 108) is doped with a p-type dopant. Examples of p-type dopants include, but are not limited to, boron, aluminum, gallium, and indium.

One example of doping concentrations comprises the body region of the elongated channel region 110 being doped to a concentration of approximately $1\times10^{18}$ atoms/cm$^3$, with the first recombination region 106 and the second recombination region 108 being doped to a concentration of approximately $5\times10^{18}$ atoms/cm$^3$ or higher. The higher doping concentration in the first recombination region 106 and the second recombination region 108 results in a lower minority carrier lifetime than in the body region of the elongated channel region 110. Another example includes the elongated channel region 110 being undoped, with the first recombination region 106 and the second recombination region 108 being doped to an effective concentration higher than the undoped body region 110.

A lower minority carrier lifetime in regions outside the plurality of memory cell gates 114 should provide better selective isolation of the elongated channel region 110 during memory operations. For example, during an erase operation, the string 101 may be selected for erasure. It is desirable in this case for other strings 101 to be isolated. By lowering a minority carrier lifetime in the first recombination region 106 and the second recombination region 108, charge is less likely to flow though unselected strings, and memory operations become more reliable, with higher performance.

Figure 1C:
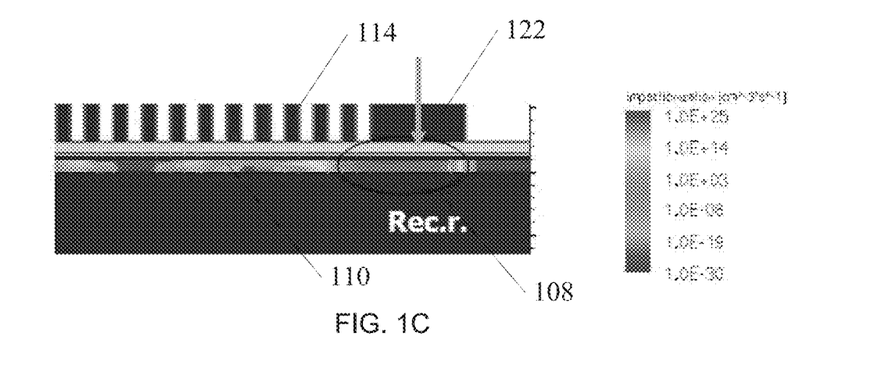
FIG. 1C shows a model of carrier generation in operation of a memory string according to an embodiment of the invention.
Figure 1D:
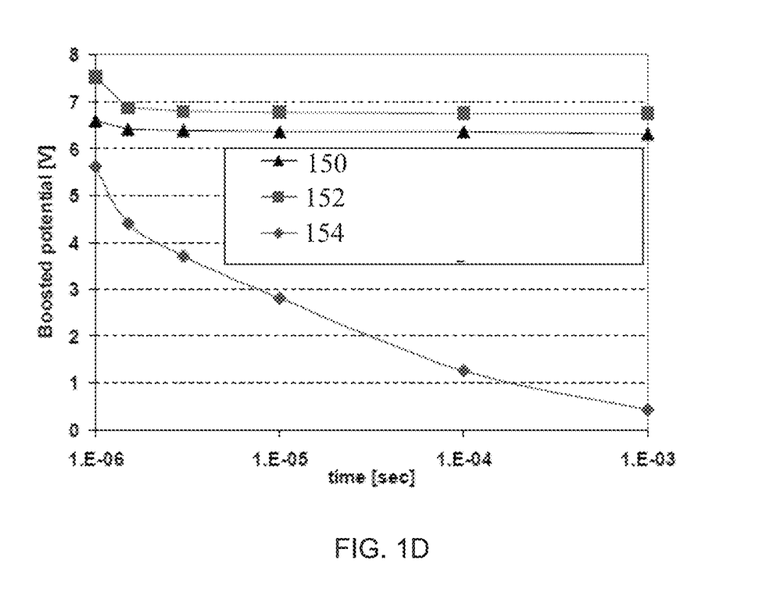
FIG. 1D shows a model of carrier generation in operation of a memory string according to an embodiment of the invention.

FIG. 1C shows a modeled example of the elongated channel region 110, recombination region 108, and memory cell gates 114. The Figure shows that in the impact ionization regions, carrier generation is sustained by the potential drop during an inhibit condition for unselected strings in an operation such as an erase operation. Without application of embodiments of the present invention, the boosted channel may lose its potential over a short time. For example, FIG. 1D shows channel region potential 154 for a device without recombination regions. As can be seen from the Figure, the channel region potential 154 degrades over time. Using a dopant engineered example according to an embodiment of the invention, the channel region potential 152 is shown to be maintained over the same time period.

Other configurations and associated processes of formation for the first recombination region 106 and the second recombination region 108 include strain engineering and alternative material choice. In strain engineering examples, an impurity element that may or may not include dopant elements is implanted or otherwise introduced into the lattice within the first recombination region 106 and the second recombination region 108. The strain provided to the lattice by the addition of the impurity element(s) modifies the regions (i.e., results in the regions having a different lattice strain condition than the body region), which results in the regions having a lower minority carrier lifetime than the body region of the elongated channel region 110.

In alternative material examples, the first recombination region 106 and the second recombination region 108 are formed from a different semiconductor material than that used to form the body region of the elongated channel region 110. The different properties of the material choice results in a lower minority carrier lifetime in the recombination regions 106, 108 than in the body region of the elongated channel region 110. FIG. 1D shows a modeled example of a material engineered example. As can be seen, the channel region potential 150 for a material engineered example is shown to be maintained over time.

In one example, the first recombination region 106 and the second recombination region 108 each extend at least from (in the case of region 106) and/or to (in the case of region 108) respective locations within the select gates 122, 120. FIG. 1B shows an example where the first recombination region 106 and the second recombination region 108 each extend from and/or to respective edges of the select gates 122, 120.

Figure 2:
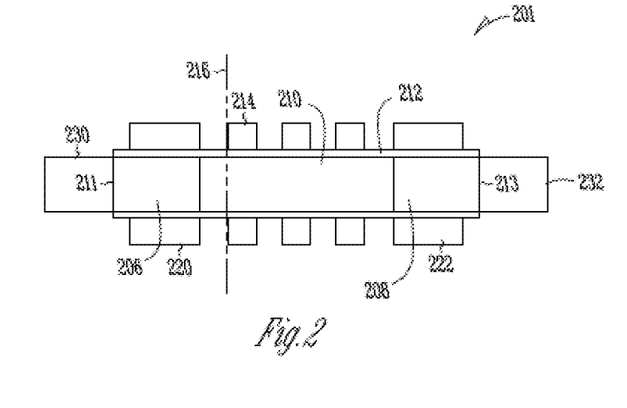
FIG. 2 shows a graph of potential versus time for channel region of a memory string according to an embodiment of the invention.

FIG. 2 shows a memory string 201. The memory string 201 comprises a source region 230 and a drain region 232 with an elongated channel region 210 coupled therebetween. A number of memory cell gates 214 are shown adjacent to the elongated channel region 210, separated from the elongated channel region 210 by a number of charge storage structures 212. A first select gate 220 is located at a first end 211 of the elongated channel region 210, and a second select gate 222 is located at a second end 213 of the elongated channel region 210.

The elongated channel region 210 comprises a first recombination region 206 and a second recombination region 208 (and an elongated body region between the first and second recombination regions 206, 208). In one example, the first recombination region 206 and the second recombination region 208 each extend from and/or to respective locations before and/or past edges of the select gates 220, 222. In the example shown in FIG. 2, the first recombination region 206 extends from a location before an edge of the select gate 220 (e.g., it extends from an edge 216 of the memory cell gates 214) and the second recombination region 208 extends to a location past an edge of the select gates 222 (e.g., it extends to another edge 217 of the memory cell gates 214).

Figure 3A:
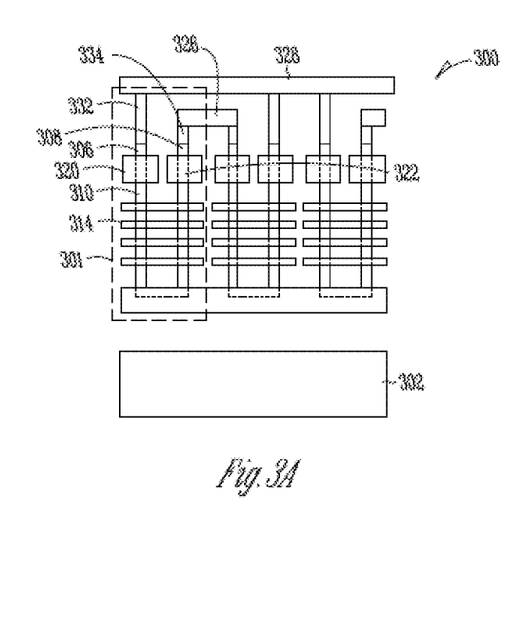
FIG. 3A shows another memory device according to an embodiment of the invention.
Figure 3B:
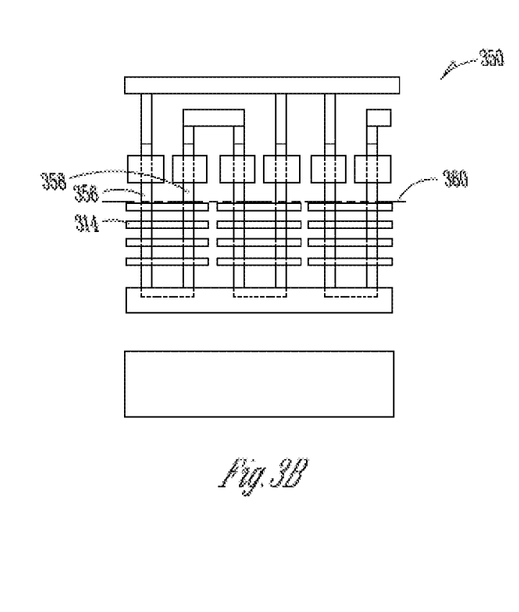
FIG. 3B shows another memory device according to an embodiment of the invention.

FIGS. 1A, 1B, and FIG. 2 illustrate memory strings that are vertical in orientation. Other configurations are also possible, comprising horizontal and "U" shaped. FIGS. 3A and 3B illustrate examples of "U" shaped memory strings. FIG. 3A shows a memory string 300, comprising a source region 332 and a drain region 334, with an elongated channel region 310 coupled therebetween and a number of memory cell gates 314 located along a length of the elongated channel region 310. In the configuration shown, the source region 332 and drain region 334 are upward facing, with the elongated channel region 310 forming the "U" shape.

In FIG. 3A, the elongated channel region 310 comprises a first recombination region 306 and a second recombination region 308 (and a body region therebetween). In one example, the first recombination region 306 and second recombination region 308 are formed as described above, using heavier doping, strain engineering, or different material choice than what is used to form the body region of the elongated channel region 310.

FIG. 3A shows the first recombination region 306 and second recombination region 308 each extending from respective edges of a first select gate 320 and a second select gate 322 respectively. FIG. 3B shows similar memory string 350, with a first recombination region 356 and a second recombination region 358 extending from locations before respective edges of the first select gate 320 and the second select gate 322 (e.g., each extending from an edge 360 of the number of gates 314.

Several different configurations of memory strings, such as vertical, horizontal, and "U" shaped, are possible, as noted with respect to previous figures. The following FIGS. 4A-4I describe an example process that can be used to form a vertical memory string. This process can be used as a general guideline to forming the configurations discussed previously, as well as other configurations.

Figure 4A:
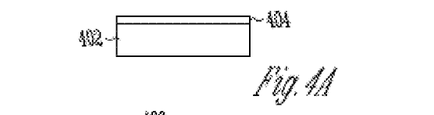
FIG. 4A-4I show processing operations for a memory device according to an embodiment of the invention.
Figure 4B:
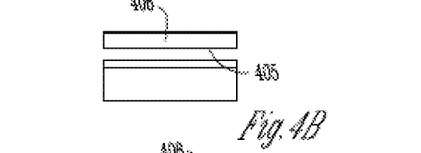

FIG. 4A shows formation of an n-type doped region 404 on part of a substrate 402. In one example, a portion of the substrate 402 forms a source line. In one example, the n-type doped region 404 is heavily doped to be n+. In FIG. 4B, a dielectric layer 405 is formed, and a layer of polysilicon 406 is formed.

Figure 4C:
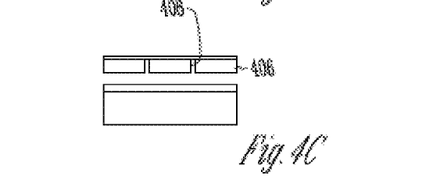
Figure 4D:
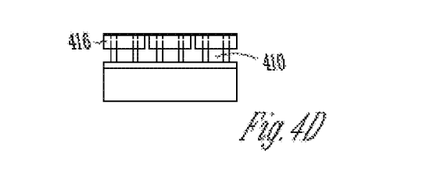

In FIG. 4C, the polysilicon 406 is patterned and etched to form openings 408 that isolate portions of the polysilicon 406. In FIG. 4D, a first recombination region 410 is formed through portions of the polysilicon 406 that form first select gates 416. In one example, the first recombination region 410 is deposited as doped polysilicon. In other examples, a material for the first recombination region 410 is deposited and subsequently doped, such as by diffusion, ion implantation, or other doping methods. In one example, the first recombination region 410 is heavily doped to be p+. In one example, the first recombination region 410 comprises a dopant concentration of approximately $5 \times 10^{18}$ atoms/cm$^3$.

In one example, the first recombination region 410 is formed by strain engineering. One example of strain engineering comprises forming a polysilicon structure, and implanting or otherwise forming with an impurity element that strains the lattice of the first recombination region 410 to modify a minority carrier lifetime in the first recombination region 410.

In one example, the first recombination region 410 is formed from a material having a lower minority carrier lifetime than a subsequently formed body region 412 of the elongated channel region. In one example, the material choice for the first recombination region 410 comprises non-silicon semiconductors, such as gallium arsenide, germanium, etc.

In the example shown in FIG. 4D, the first recombination region 410 extends from the doped region 404 through the polysilicon 406, to an edge of the first select gate 416. In other examples, as shown in FIG. 2, the first recombination region 410 extends past the edge of the first select gate 416 and up to an edge of a number of memory cell gates. In many embodiments, the first recombination region 410 is a part of an elongated channel region that is formed in multiple processing operations.

Figure 4E:
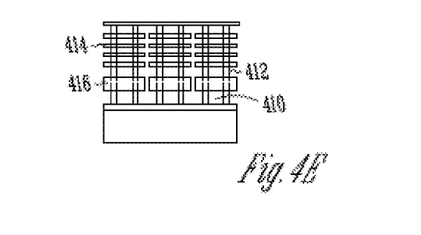

FIG. 4E shows the formation of a body region 412 of the elongated channel region, and formation of a number of memory cell gates 414 along a length of the body region 412 of the elongated channel region. In one example, the body region 412 is p-type doped, but in other examples it could be doped differently or undoped. In one example, the region 412 comprises a p-type dopant concentration of approximately $1 \times 10^{18}$ atoms/cm$^3$. As noted above, the body region 412 is a part of an elongated channel region that is formed in multiple processing operations.

Figure 4F:
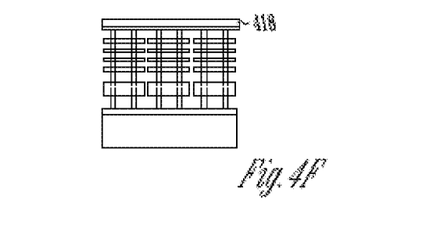
Figure 4G:
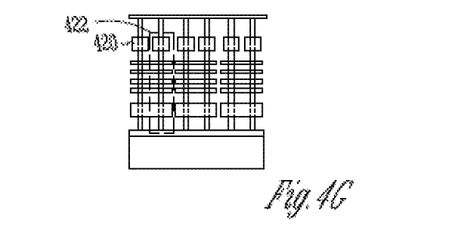

FIG. 4F shows formation of another polysilicon layer 418. In FIG. 4G, the polysilicon layer 418 is patterned and etched to form second select gates 420. In the example shown, the first select gate 416 is shared by two adjacent strings 422, while each second select gate 420 is dedicated to an individual memory string 422. Other examples include combinations of shared second select gates 420 and individual first select gates 420, depending on the requirements of a memory device configuration.

Figure 4H:
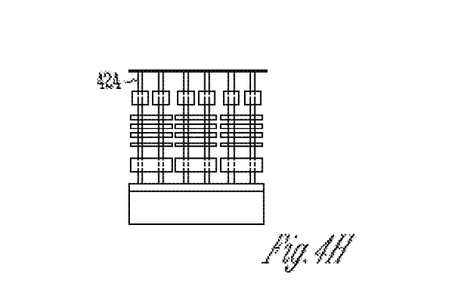

In FIG. 4H, a second recombination region 424 is formed through the second select gates 420. As with the first recombination region 410, in one example, the second recombination region 424 is deposited as doped polysilicon. In other examples, a material for the second recombination region 424 is deposited and subsequently doped, such as by diffusion, ion implantation, or other doping methods. In one example, the second recombination region 424 is heavily doped to be p+. In one example, the second recombination region 424 comprises a dopant concentration of approximately $5 \times 10^{18}$ atoms/cm$^3$. Other examples such as strain engineering, or material choice as is the case with the first recombination region 410, can be used in the second recombination region 424 to provide a lower minority carrier lifetime than the body region 412 of the elongated channel region.

In the example shown in FIG. 4H, the second recombination region 424 extends from an edge of the second select gates 420. In other examples, as shown in FIG. 2, the second recombination region 424 extends from an edge of the number of memory cell gates 414. As noted above, the second recombination region 424 is a part of an elongated channel region that is formed in multiple processing operations.

Figure 4I:
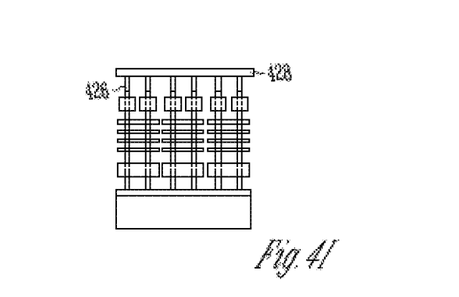

In FIG. 4I, an n-type doped region 426 is formed such that it is connected to the second recombination region 424. In an embodiment where the elongated channel region is a p-type doped region, the n-type doped region 426, the elongated channel region (comprising the second recombination region 424, the body region 412, and the first recombination region 410) and the n-type doped region 404 form an n-p-n junction that functions as a memory string. Lastly, in FIG. 4I, a data line 428 (e.g. a bit line) is formed to connect memory strings and form a memory device.

Figure 5:
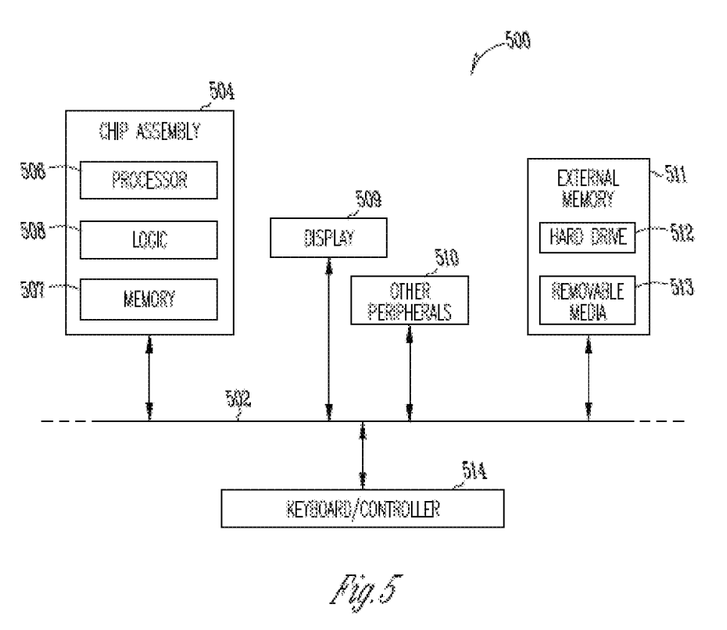
FIG. 5 shows an information handling system using a memory device according to an embodiment of the invention.

An embodiment of an apparatus in the form of an information handling system, such as a computer, is included in FIG. 5 to show an embodiment of a high-level device application for the present invention. FIG. 5 is a block diagram of an information handling system 500 incorporating one or more memory devices 507 according to embodiments of the invention as described above. Information handling system 500 is merely one embodiment of an electronic system in which memory devices of the present invention can be used. Other examples include, but are not limited to, tablet computers, cameras, personal data assistants (PDAs), cellular telephones, MP3 players, aircraft, satellites, military vehicles, etc.

In this example, information handling system 500 comprises a data processing system that comprises a system bus 502 to couple the various components of the system. System bus 502 provides communications links among the various components of the information handling system 500 and may be implemented as a single bus, as a combination of busses, or in any other suitable manner.

Chip assembly 504 is coupled to the system bus 502. Chip assembly 504 may include any circuit or operably compatible combination of circuits. In one embodiment, chip assembly 504 comprises a processor 506 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 507 is included in the chip assembly 504. In one embodiment, the memory device 507 comprises a memory device, such as a NAND memory device according to embodiments described above. The memory device 507 formed according to the processes described herein may also be embodied as a separate device or chip (not forming part of the chip assembly 504, in combination with a processor 506 and/or logic 508) coupled to the bus 502.

In one embodiment, additional logic chips 508 other than processor chips are included in the chip assembly 504. An example of a logic chip 508 other than a processor comprises an analog to digital converter. Other circuits on logic chips 508 such as custom circuits, an application-specific integrated circuit (ASIC), etc. are also included in one embodiment of the invention.

Information handling system 500 may also include an external memory 511, which in turn can include one or more memory elements suitable to the particular application, such as one or more hard drives 512, and/or one or more drives that handle removable media 513 such as compact disks (CDs), flash drives, digital video disks (DVDs), and the like. A semiconductor memory die constructed as described in examples above is included in the information handling system 500, perhaps as part of the memory 511.

Information handling system 500 may also include a display device 509 such as a monitor or touch screen, additional peripheral components 510, such as speakers, etc. and a keyboard and/or controller 514, which can include a mouse, touch screen, trackball, game controller, voice-recognition device, or any other device that permits a system user to input information into and receive information from the information handling system 500.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. An apparatus, comprising:
an elongated channel region, having a source region coupled to a first end, and a drain region coupled to a second end; and
a number of memory cell gates disposed along a length of a body region of the elongated channel region, each of the plurality of gates being separated from the elongated channel region by a respective charge storage structure,
wherein the elongated channel region further comprises a first recombination region located at the first end of the elongated channel region, and a second recombination region located at the second end of the elongated channel region, wherein the body region is between the first and second recombination regions, and wherein at least one of the first recombination region and the second recombination region have a lower minority carrier lifetime than the body region.

2. The apparatus of claim 1, wherein the at least one of the recombination regions has a different doping concentration than the body region.

3. The apparatus of claim 1, wherein the at least one of the recombination regions has a different lattice strain condition than the body region.

4. The apparatus of claim 1, wherein the at least one of the recombination regions comprises a different semiconductor material than the elongated channel region.

5. The apparatus of claim 1, wherein the elongated channel region is doped p-type and the source and drain regions are doped n-type, and wherein the at least one of the recombination regions of the channel region is doped to a higher concentration than the body region of the channel region.

6. The apparatus of claim 1, wherein the charge storage structures include a dielectric layer.

7. The apparatus of claim 1, wherein the apparatus comprises an array of NAND memory strings.

8. The apparatus of claim 7, wherein the apparatus further comprises a processor coupled to a memory device comprising the array of NAND memory strings.

9. The apparatus of claim 8, further comprising a display device coupled to the processor.

10. An apparatus, comprising:
a p-type doped elongated channel region, having a source region coupled to a first end, and a drain region coupled to a second end; and
a number of memory cell gates disposed along a length of a middle portion of the elongated channel region, each of the plurality of gates being separated from the elongated channel region by a respective charge storage structure,
wherein a p-dopant concentration is higher at the first end and the second end of the p-type doped elongated channel region than in the middle portion of the elongated channel region.

11. The apparatus of claim 10, wherein the elongated channel region is oriented vertically with respect to a substrate surface.

12. The apparatus of claim 10, wherein at least a portion of the elongated channel region is oriented horizontally with respect to a substrate surface.

13. The apparatus of claim 10, wherein the elongated channel region forms a "U" shape.

14. The apparatus of claim 10, further comprising a first select gate adjacent to the first end and a second select gate adjacent to the second end.

15. A method of forming a memory string, comprising:
forming source and drain regions;
forming an elongated channel region coupled between the source and drain regions; and
forming a number of memory cell gates, each of the memory cell gates being separated from the elongated channel region by a respective charge storage structure,
wherein forming the elongated channel region comprises forming end portions of the elongated channel region wherein at least one of the end portions has a lower minority carrier lifetime than a middle portion of the elongated channel region.

16. The method of claim 15, wherein forming source and drain regions comprises forming an n-type doped source and drain region, and wherein forming an elongated channel region comprises forming a p-type doped elongated channel region.

17. The method of claim 15, wherein forming end portions comprises depositing doped polysilicon with a higher dopant concentration to form the end portions than is used to form the middle portion.

18. The method of claim 15, wherein forming end portions comprises implanting dopants in a higher dopant concentration to form the end portions than is used to form the middle portion of the elongated channel region.

19. The method of claim 15, further comprising forming a first select gate adjacent to a first one of the end portions of the elongated channel region and a second select gate adjacent to a second one of the end portions of the elongated channel region.

20. The method of claim 19, wherein forming the select gates comprises forming each of the select gates to at least partially surround the respective adjacent end portion.

21. The method of claim 19, wherein forming end portions comprises forming the end portions to extend at least from and/or to respective locations within the select gates.

22. A method of forming a memory string, comprising:
   forming an n-type source region and an n-type drain region;
   forming a p-type elongated body region;
   forming a number of memory cell gates, each of the memory cell gates being separated from the elongated body region by a respective charge storage structure;
   forming a first more heavily doped p-type region than the p-type elongated body region between the n-type source region and the p-type elongated body region; and
   forming a second more heavily doped p-type region than the p-type elongated body region between the n-type drain region and the p-type elongated body region.

23. The method of claim 22, wherein forming the first and second more heavily doped p-type region comprises depositing doped polysilicon.

24. The method of claim 23, wherein depositing the doped polysilicon comprises depositing polysilicon doped to a concentration of approximately $5 \times 10^{18}$ atoms/cm$^3$ or higher.

25. The method of claim 22, wherein forming a p-type elongated body region comprises forming an elongated body region doped to a concentration of approximately $1 \times 10^{18}$ atoms/cm$^3$.

26. The method of claim 22, wherein forming the first more heavily doped p-type region and the second more heavily doped p-type region comprises forming the first more heavily doped p-type region and the second more heavily doped p-type region that extend from an edge of the number of memory cell gates.

27. The method of claim 22, further comprising forming a first select gate adjacent to the first more heavily doped p-type region and a second select gate adjacent to the second more heavily doped p-type region; and
   wherein forming the first more heavily doped p-type region comprises forming a first more heavily doped p-type region that extends to an edge of the first select gate and wherein forming the second more heavily doped p-type region comprises forming a second more heavily doped p-type region that extends from an edge of the second select gate.

28. The method of claim 22, wherein forming the first more heavily doped p-type region comprises forming a first more heavily doped p-type region that extends to an edge of the number of memory cell gates and wherein forming the second more heavily doped p-type region comprises forming a second more heavily doped p-type region that extends from another edge of the number of memory cells.

29. The method of claim 22, further comprising forming a first select gate adjacent to the first more heavily doped p-type region and a second select gate adjacent to the second more heavily doped p-type region; and
   wherein forming the first more heavily doped p-type region comprises forming a first more heavily doped p-type region that extends from an edge of the first select gate and wherein forming the second more heavily doped p-type region comprises forming a second more heavily doped p-type region that extends from an edge of the second select gate.

\* \* \* \* \*